(12) United States Patent
Zhang et al.

(10) Patent No.: US 12,451,351 B2
(45) Date of Patent: Oct. 21, 2025

(54) METHOD FOR PREPARING A SUBSTRATE

(71) Applicant: ENKRIS SEMICONDUCTOR, INC., Suzhou (CN)

(72) Inventors: Liyang Zhang, Suzhou (CN); Kai Cheng, Suzhou (CN)

(73) Assignee: ENKRIS SEMICONDUCTOR, INC., Suzhou (CN)

( * ) Notice: Subject to any disclaimer, the term of this patent is extended or adjusted under 35 U.S.C. 154(b) by 531 days.

(21) Appl. No.: 17/552,755

(22) Filed: Dec. 16, 2021

(65) Prior Publication Data

US 2022/0108890 A1 Apr. 7, 2022

Related U.S. Application Data

(63) Continuation-in-part of application No. 16/653,038, filed on Oct. 15, 2019, now abandoned, which is a
(Continued)

(51) Int. Cl.
*H01L 21/02* (2006.01)
*C23C 16/30* (2006.01)
(Continued)

(52) U.S. Cl.
CPC ...... *H01L 21/02658* (2013.01); *C23C 16/303* (2013.01); *C30B 25/02* (2013.01); *C30B 29/406* (2013.01); *H01L 21/0243* (2013.01); *H01L 21/02614* (2013.01); *H01L 21/02378* (2013.01); *H01L 21/02381* (2013.01); *H01L 21/02389* (2013.01); *H01L 21/02439* (2013.01);
(Continued)

(58) Field of Classification Search
CPC ....... H01L 21/30604; H01L 2924/0002; H01L 31/02363; H01L 35/32; H01L 21/306; H01L 2924/00; H01L 2924/00014; H01L 2224/48091; H01L 2224/73265
See application file for complete search history.

(56) References Cited

U.S. PATENT DOCUMENTS

| 6,790,785 B1* | 9/2004 | Li | H01L 21/0203 205/606 |
| 10,943,982 B2* | 3/2021 | Grossman | H01L 29/32 |
| 2015/0255718 A1* | 9/2015 | Liu | H10N 70/20 257/4 |

FOREIGN PATENT DOCUMENTS

| CN | 102760812 A | 10/2012 |
| CN | 103682016 A | 3/2014 |

(Continued)

OTHER PUBLICATIONS

CN103682016 [Machine's translation] Mar. 26, 2014.*
CN 105789026 [machine's translation]. (Year: 2016).*

*Primary Examiner* — Tony Tran
(74) *Attorney, Agent, or Firm* — Westbridge IP LLC

(57) ABSTRACT

Disclosed is a method for preparing a substrate relate to the field of semiconductors. The method comprises the following steps: S1, providing a reaction container in which a base substrate is mounted; S2, conducting a metal source into the reaction container, and forming a thin film layer on a surface of the base substrate, wherein a part of a surface of the base substrate is covered by the thin film layer, so that the base substrate is provided with an exposed surface that is not covered by the thin film layer; and S3, conducting a corrosive gas into the reaction container to form one or more recessed holes in at least a part of the exposed surface.

11 Claims, 14 Drawing Sheets

Related U.S. Application Data continuation of application No. PCT/CN2017/100946, filed on Sep. 7, 2017.

(51) Int. Cl.
    *C30B 25/02*     (2006.01)
    *C30B 29/40*     (2006.01)

(52) U.S. Cl.
    CPC .. *H01L 21/02458* (2013.01); *H01L 21/02499* (2013.01); *H01L 21/0254* (2013.01)

(56) References Cited

FOREIGN PATENT DOCUMENTS

| | | |
|---|---|---|
| CN | 105789026 A | 7/2016 |
| TW | 200703461 A | 1/2007 |
| TW | 201349564 A | 12/2013 |

\* cited by examiner

METHOD FOR PREPARING A SUBSTRATE

CROSS-REFERENCE TO RELATED APPLICATIONS

This application is a continuation-in-part of U.S. patent application Ser. No. 16/653,038, filed on Oct. 15, 2019, which is a continuation of International Application No. PCT/CN2017/100946, filed on Sep. 7, 2017. Both of the aforementioned applications are hereby incorporated by reference in their entireties.

TECHNICAL FIELD

Embodiments of the present disclosure relate to the field of semiconductor technology, in particular to a substrate and a method for preparing the same.

BACKGROUND

III-V compound semiconductors such as GaAs, InP, GaN, etc. have advantages such as high electron mobility and wide bandgap with respect to traditional semiconductors such as Ge, Si, etc. and are widely used in the fields of microwave and optoelectronic devices. At present, sapphire, silicon and silicon carbide are commonly used as substrates for growth of the III-V compound semiconductors. However, when the III-V compound semiconductors (such as GaN) are grown on the above-mentioned substrates, there are some problems such as lattice mismatch and thermal stress mismatch, which may lead to warping and even cracking in a grown GaN epitaxial layer, and may also lead to high threading dislocation density in the GaN epitaxial layer, thereby affecting the performance of materials and devices, causing difficulty in subsequent processes of device fabrication, and increasing production costs. The prior art tries to solve the relative problems by performing photolithography to the substrate so as to make patterns on the substrate, or by adding a buffer layer in the middle of the epitaxial layer.

In the process of implementing the present disclosure, the inventors have found that at least the following problems exist in the prior art:
  it is relatively difficult to grow a high quality III-V compound semiconductor structure on a substrate at low cost,
  1) the substrate is processed by photolithography or etching to make patterned substrates, but this process is complex, the production cost is high, and the epitaxial layer which is subsequently grown may be contaminated;
  2) adding a buffer layer, such as multi-layer AlGaN, in the middle of an epitaxial layer may accumulate stress, balance thermal tension stress in the epitaxial layer that is exerted by the substrate, and realize warping control of the epitaxial layer on the substrate. However, such structure still has a high threading dislocation density, makes stress releasing become faster, and limits the thickness of growth of the epitaxial layer.

SUMMARY

Purposes of the present disclosure are to provide a substrate and a method for preparing the same, which can solve problems that stresses are generated due to lattice mismatch and thermal stress mismatch in the preparation process.

An embodiment of the present disclosure discloses a substrate including a base substrate; a thin film layer, wherein the thin film layer covers a part of a surface of the base substrate, so that the base substrate is provided with an exposed surface that is not covered by the thin film layer; and one or more recessed holes formed in at least a part of the exposed surface.

Preferably, a diameter of the recessed hole is less than 500 nm.

Preferably, the base substrate is made of silicon, silicon carbide or gallium nitride.

Preferably, the thin film layer is made of Al, Fe, Mg or In.

An embodiment of the present disclosure discloses a method for preparing a substrate including the following steps: S1, providing a reaction container in which a base substrate is mounted; S2, conducting a metal source into the reaction container, and forming a thin film layer on a surface of the base substrate, wherein a part of the surface of the base substrate is covered by the thin film layer, so that the base substrate is provided with an exposed surface that is not covered by the thin film layer; and S3, conducting a corrosive gas into the reaction container to form one or more recessed holes in at least a part of the exposed surface.

Preferably, in the step S3, a diameter of the recessed hole(s) is less than 500 nm.

Preferably, in the step S1, the base substrate is made of silicon, silicon carbide or gallium nitride.

Preferably, in the step S1, the reaction container is a metal-organic chemical vapor deposition reactor, an atomic deposition reactor or a chemical beam epitaxial reactor.

Preferably, in the step S3, the corrosive gas is $NH_3$, $H_2$, HCl or $Cl_2$.

Preferably, when the base substrate is made of silicon, after the step S3, a Ga source is conducted into the reaction container, or a Ga-containing compound is prepared on the thin film layer.

Preferably, before the step S2, the method further comprises: heating the base substrate.

Preferably, a temperature of the base substrate is greater than or equal to a melting point of the thin film layer.

Preferably, a thickness of the thin film layer is less than or equal to 10 nm.

Preferably, a thickness of the thin film layer is less than or equal to 1 nm.

Preferably, a thickness of the thin film layer is less than or equal to a thickness of a monolayer.

Preferably, the method further comprises: conducting nitride gas to perform a nitridation reaction of the thin film layer.

Preferably, the thin film layer is made of one of Al, Fe, Mg and In.

Preferably, the thin film layer is provided with pores which correspond to the exposed surface.

Preferably, the metal source is conducted into the reaction container in pulse mode.

Preferably, the step S2 and the step S3 are executed alternately multiple times.

Preferably, the method further comprises: increasing a temperature in the reaction container in the step S2 and/or the step S3.

The beneficial effects of the present disclosure lie in that, for the substrate disclosed in the present disclosure, since the one or more recessed holes are formed in a part of the surface of the substrate, the stress that are generated due to lattice mismatch and thermal stress mismatch when an epitaxial layer is grown on the substrate in the subsequent semiconductor process can be released, and a risk of occurrence of defects and cracks in the epitaxial layer as grown due to excessive pressure may be reduced, thereby reducing a warping of a semiconductor subsequently prepared on the substrate and making the semiconductor have a better quality and performance. The method for preparing the substrate disclosed in the present disclosure is simple, efficient and low-cost, may allow the one or more recessed holes to be formed in the substrate without complicated etching process, may allow forming the one or more recessed holes in the substrate to be performed in one and the same reaction container successively with a subsequent epitaxial growth process, and may release the stresses generated due to lattice mismatch and thermal stress mismatch when the epitaxial layer is grown on the substrate.

The above description is only an overview of the technical solutions of the present disclosure. In order for the technical means of the present disclosure to be more clearly understood and to be implemented in accordance with the contents of this specification, the preferable embodiments of the present disclosure will be described hereinafter in detail with reference to the accompanying drawings.

BRIEF DESCRIPTION OF DRAWINGS

The following will describe the present disclosure in association with embodiments and with reference to the drawings. In the drawings.

DETAILED DESCRIPTION

Figure 1:
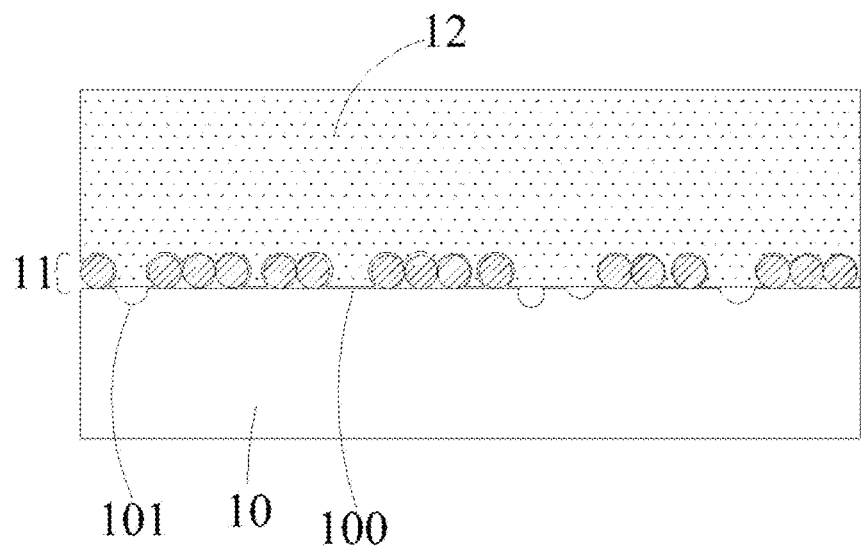
FIG. 1 is a schematic structural diagram of a semiconductor device adopting a substrate as illustrated in an embodiment of the present disclosure.

The drawings are only used for exemplary illustration, and can not be interpreted as limitation to the present patent. The following will further describe the technical solutions of the present disclosure in association with the drawings and embodiments. In the description of embodiments of the present disclosure, it is understood that, when an element is stated to be "above" or "below" another element, the element can be "directly" located "above" or "below" the other element (they directly contact each other), or the element can be "indirectly" located "above" or "below" the other element (there is a further element between them). For the sake of convenience or clarity, the thickness and dimension of each element as shown in the drawings may be enlarged, shrunk, or schematically depicted, and the dimension of the elements do not represent the real dimension.

The main equipment for carrying out the present disclosure is a metal-organic chemical vapor deposition reactor, an atomic deposition reactor or a chemical beam epitaxial reactor. For preparation of different semiconductor structures, various growth parameters are adjusted according to specific conditions.

Please refer to FIG. 1 which is a schematic structural diagram of a semiconductor device adopting a substrate according to an embodiment of the present disclosure. The substrate shown in the embodiment of the present disclosure includes a base substrate 10, a thin film layer 11 and one or more recessed holes 101. A part of a surface of the base substrate 10 is covered by the thin film layer 11, i.e., the base substrate 10 has an exposed surface 100 that is not covered by the thin film layer 11. The one or more recessed holes 101 are randomly formed in at least a part of the exposed surface 100. It should be understood that the configuration illustrated in FIG. 1 is not the only configuration of the present disclosure, the exposed surface 101 is randomly distributed on the surface of the base substrate 10, and the size of the exposed surface 100 is variable. The one or more recessed holes 101 are also randomly distributed on the exposed surface 100, the size of the one or more recessed holes 101 are variable, and a diameter of the recessed hole 101 is preferably less than 500 nm.

The base substrate 10 is preferably made of silicon. Of course, the base substrate 10 may also be made of silicon carbide, gallium nitride or the like.

The thin film layer 11 is a metal thin film, and is preferably an aluminum thin film. Of course, in other embodiments, the thin film layer 11 may also be other metal thin films such as a magnesium thin film, an iron thin film, and an indium thin film.

A semiconductor device adopting a substrate according to an embodiment of the present disclosure includes an epitaxial layer 12 disposed on the substrate. Taking a GaN device on a substrate of which a base substrate is made of Si as an example, an epitaxial layer 12 may include AlN, GaN, AlGaN, or the like.

The beneficial effects of this embodiment of the present disclosure lie in that, for the substrate disclosed in the present disclosure, since the one or more recessed holes are randomly formed in a part of the surface of the substrate, the stresses that are generated due to the lattice mismatch and the thermal stress mismatch when the epitaxial layer is grown on the substrate in the subsequent semiconductor processes can be released, and a risk of occurrence of defects and cracks in the epitaxial layer as grown due to excessive pressure may be reduced, thereby reducing the warping degree of the semiconductor subsequently prepared on the substrate and making the semiconductor have a better quality and performance. In addition, what is disclosed in the present disclosure may be a flexible substrate.

In association with FIG. 1, the present disclosure also discloses a method for preparing a substrate, as follows:

S1, providing a reaction container in which a base substrate 10 is mounted;

S2, conducting a metal source into the reaction container, and forming a thin film layer 11 on a surface of the base substrate 10, a part of the surface of the base substrate 10 being covered by the thin film layer 11, so that the base substrate 10 is provided with an exposed surface 100 that is not covered by the thin film layer 11; and S3, conducting a corrosive gas into the reaction container to form one or more recessed holes 101 in at least a part of the exposed surface. The diameter of the recessed hole 101 is preferably less than 500 nm.

The metal source conducted into the reaction container may be metal organics (MO) precursor, such as TMAl.

Before the step S2 of the embodiment, the method may further comprise: heating the base substrate 10 to increase a temperature of the base substrate 10. The temperature of the base substrate 10 may be greater than or equal to a melting point of the thin film layer 11. For example, the thin film layer 11 is Al, and the temperature of the base substrate 10 may be greater than or equal to a melting point of Al which is 647° C.

Due to the high temperature of the base substrate 10, a part of the metal source can be vaporized into the reaction container during forming the thin film layer. That is to say, a dynamic process of the metal source deposition and vaporization is realized, which can simplify the steps of forming the thin film layer 11.

In the step S2 of the embodiment, the thin film layer 11 covers a part of the surface of the base substrate 10. That is to say, the thin film layer 11 is a discontinuous thin film. As an embodiment, the film layer 11 is provided with pores which correspond to the exposed surface. The thin film layer 11 can be used as a mask for selective etching to form the one or more recessed holes 101 on the exposed surface 100 of the base substrate 10.

The pores may be nanometer-sized. For example, the diameter of the pores may be less than or equal to 500 nm.

A thickness of the film layer 11 may be as small as possible. For example, the thickness of the thin film layer is less than or equal to 10 nm or 1 nm. Alternatively, the thickness of the film layer 11 is less than or equal to a thickness of a monolayer.

After the step S2 of the embodiment, the method may further comprise: conducting nitride gas to perform a nitridation reaction of the thin film layer to form a high temperature resistant material. For example, the material of the thin film layer 11 comprises Al, and $NH_3$ can be conducted into the reaction container to form AlN.

In the step S3 of the embodiment, the reaction container may be heated to the temperature of an epitaxial layer 12 of the semiconductor device subsequently adopting the substrate of the present disclosure (e.g., the growth temperature of a III-V compound AlN at 500-1400° C.), and then corrosive gas may pass into the reaction container, so that the epitaxial layer 12 can be grown in the reaction container right after the one or more recessed holes 101 are formed in the exposed surface of the base substrate 10.

In the above preparation method, the reaction container is preferably an metal-organic chemical vapor deposition reactor. Of course, in other embodiments, the reaction container may also be an atomic deposition reactor or a chemical beam epitaxial reactor, as desired in processes. The substrate 20 is a silicon substrate; of course, in other embodiments the substrate 20 may also be a silicon carbide substrate or a gallium nitride substrate. The metal source is an aluminum source; of course, in other embodiments the metal source may also be another metal source such as a magnesium source, an iron source, and an indium source. The corrosive gas is $NH_3$; of course, in other embodiments, the corrosive gas may also be HCl or $H_2$ or $Cl_2$.

Figure 2:
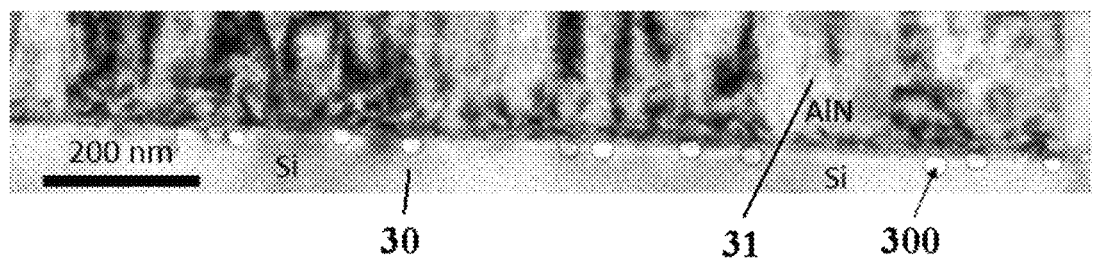
FIG. 2 is a TEM characterization diagram of a semiconductor device adopting a substrate as illustrated in an embodiment of the present disclosure.
Figure 3:
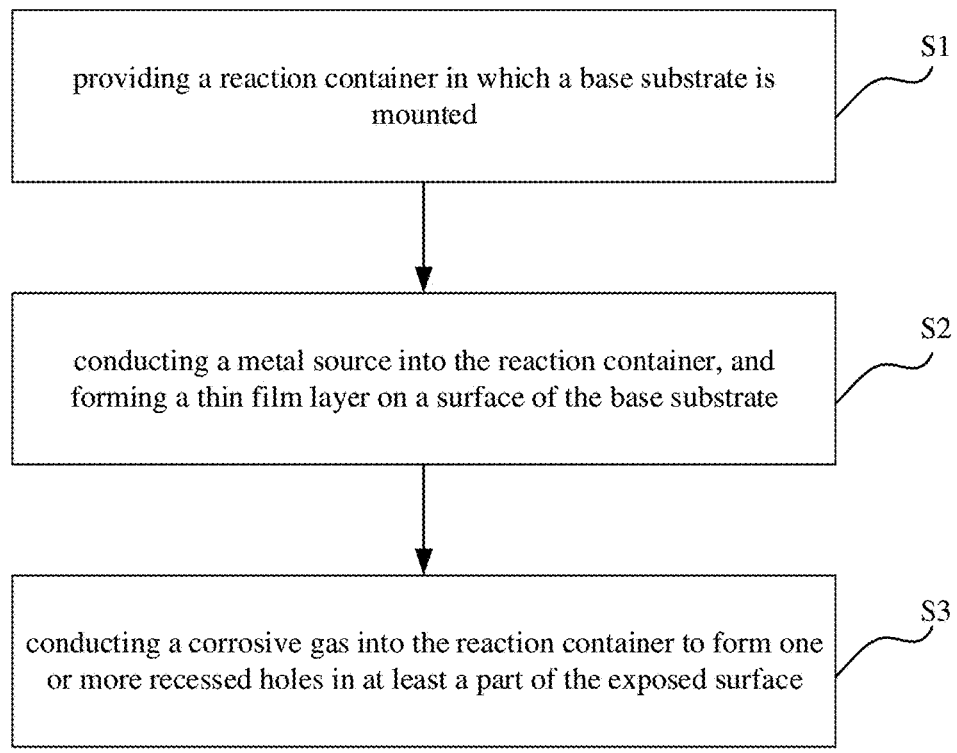
FIG. 3 is a schematic diagram of method for preparing a substrate illustrated in an embodiment of the present disclosure.

Referring to FIG. 2, FIG. 2 is a TEM characterization diagram of a semiconductor device using a substrate according to an embodiment of the present disclosure. A base substrate 30 is made of silicon, and a part of the surface of the base substrate 30 is covered with a thin film layer (not labeled). A plurality of recessed holes 300 are formed in a part of an exposed surface (not labeled) of the silicon substrate 30 that is not covered by the thin film layer, and then an epitaxial layer 31 (e.g., AlN) is formed thereon. Forming the plurality of recessed holes 300 in a part of the exposed surface of the base substrate 30 may release the stress generated due to the lattice mismatch and the thermal stress mismatch between the base substrate 30 and a GaN epitaxial layer when the GaN epitaxial layer is grown, and therefore, the GaN epitaxial layer as grown is prevented from having high warping and even cracking.

The beneficial effects of this embodiment of the present disclosure lie in that, the method for preparing the substrate is simple, efficient and low-cost, may allow the recessed holes to be formed in the substrate without complicated etching process, may be performed in one and the same reaction container successively with a subsequent epitaxial growth process, and may release the stress generated due to lattice mismatch and thermal stress mismatch when the epitaxial layer is grown on the substrate.

A method for enlarging the diameter of recessed hole 101 is also disclosed in another embodiment of the present disclosure. When a base substrate 10 is made of silicon, after step S3, i.e. conducting a corrosive gas into a reaction container to form the one or more recessed holes 101 in at least a part of an exposed surface, a Ga source is conducted into the reaction container, or a Ga-containing compound (e.g., GaN, AlGaN, AlINGaN, etc.) is epitaxially grown on a thin film layer 11, and the one or more recessed holes 101 are further etched by means of a remelting reaction between Ga atoms and the silicon substrate, thereby enlarging the diameter of the recessed hole 101.

The beneficial effects of this embodiment of the present disclosure lie in that the diameter of the recessed hole 101 may be enlarged through the remelting reaction between Ga and silicon.

The technical features of the above-mentioned embodiments may be combined arbitrarily. For the sake of concise description, not all possible combinations of the technical features in the above-mentioned embodiments are described. Of course, as long as there is no contradiction in the combinations of these technical features, they should be considered as falling in the scope of the specification.

Preferably, the step S2 and the step S3 may be executed alternately multiple times. That is to say, the formation and the etching of the thin film layer 11 may be executed alternately multiple times. It can avoid the one or more recessed holes 101 over-sized or concentrated distribution, thereby the one or more recessed holes 101 may meet the size requirement and be evenly distributed.

FIGS. 4-27 are schematic diagrams of methods for preparing a substrate illustrated in embodiments of present disclosure. Every method involved in FIGS. 4-27 may comprise 5 stages. MO precursor may be the metal source such as TMA1. Carrier gas may be $H_2$, $N_2$ or a mixture of $H_2$ and $N_2$. Hydride may be $NH_3$ or $H_2$. The stage in which the MO precursor is conducted into the reaction container is step 2. The stage in which the MO precursor is not conducted into the reaction container and the hydride is conducted into the reaction container is step 3.

Figure 4:
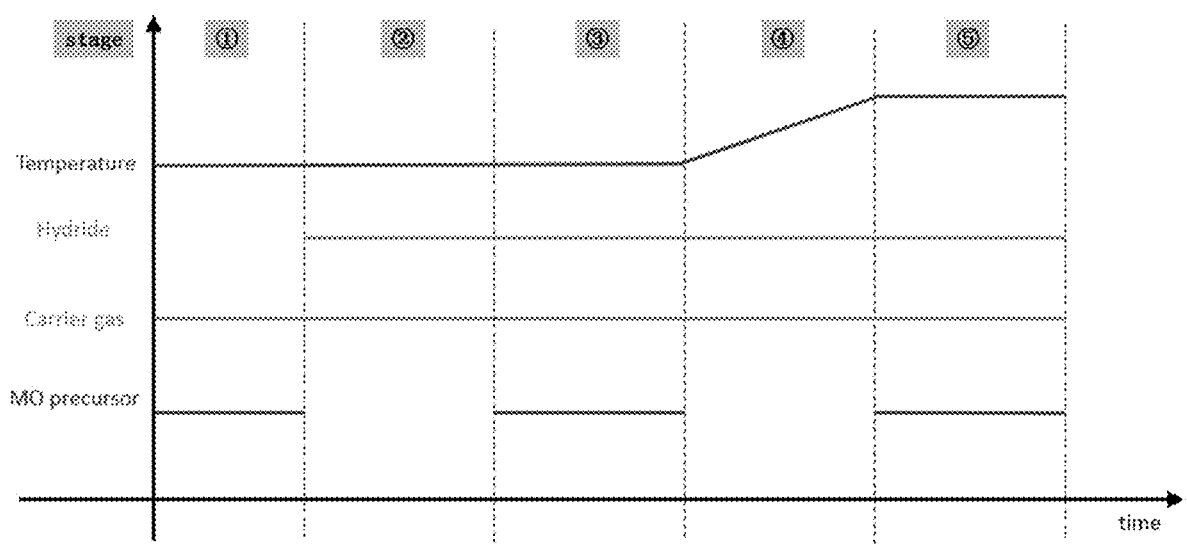
FIGS. 4-27 are schematic diagrams of methods for preparing a substrate illustrated in embodiments of the present disclosure.
Figure 5:
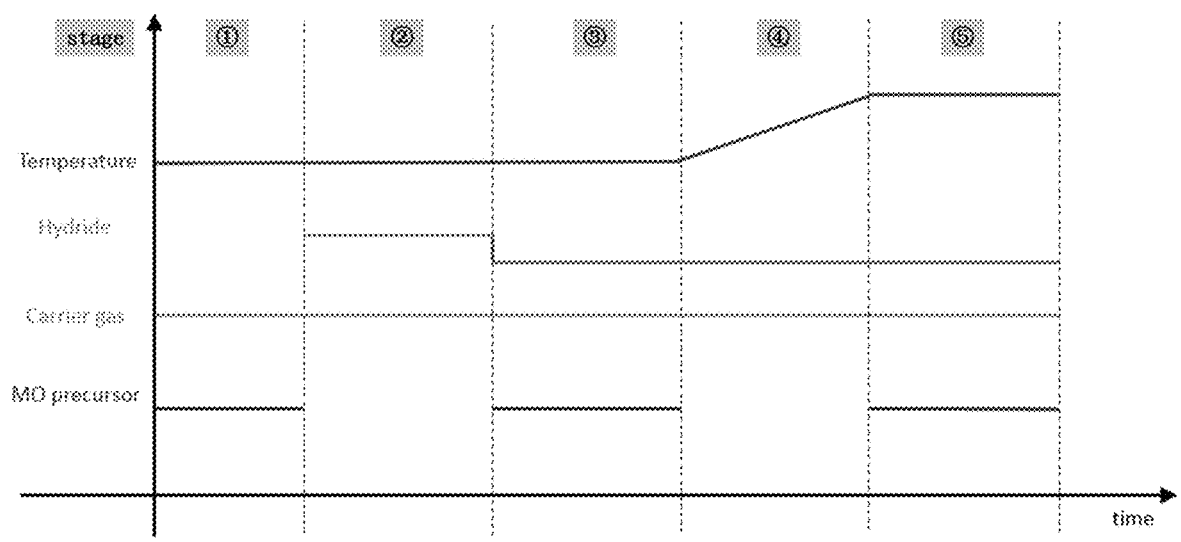
Figure 6:
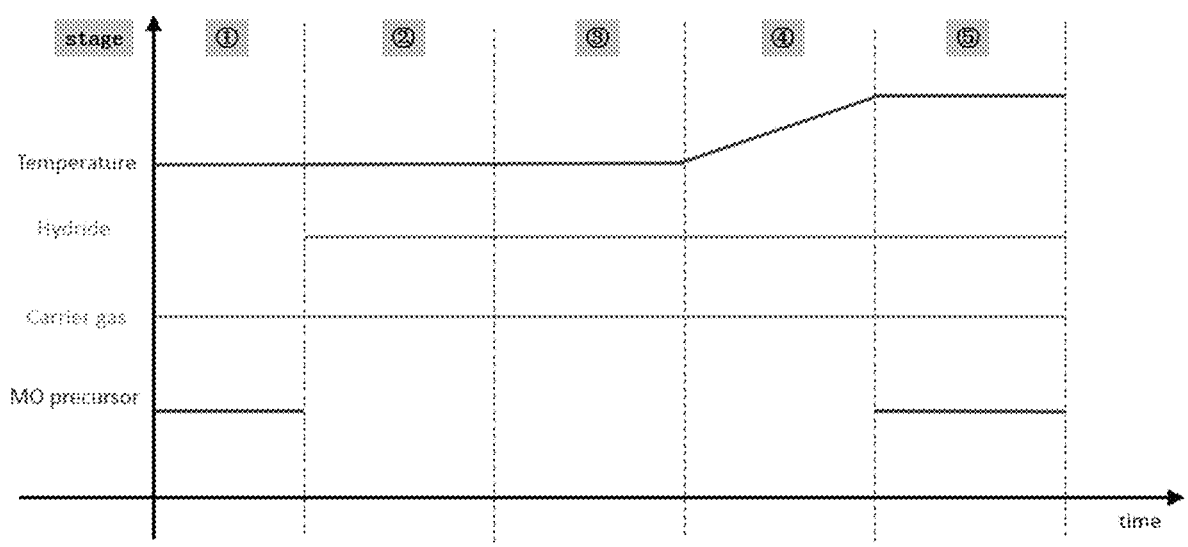
Figure 7:
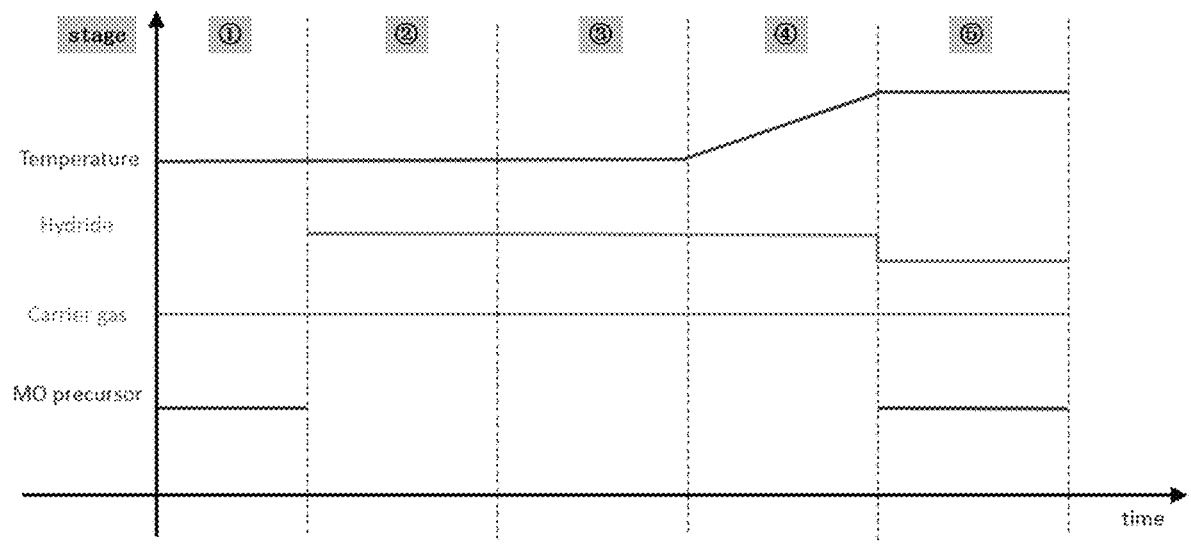
Figure 8:
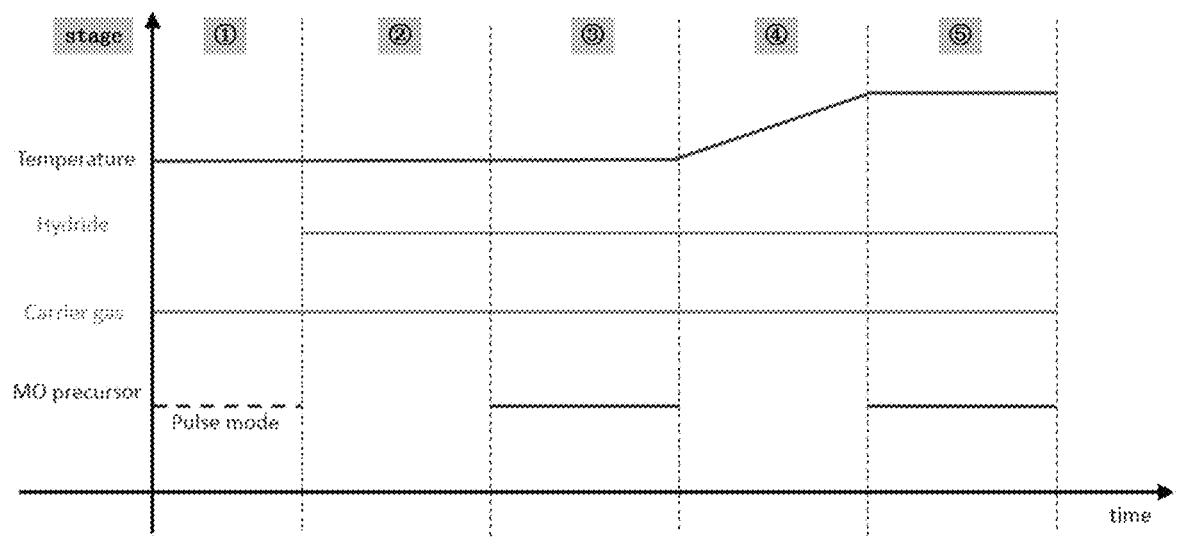
Figure 9:
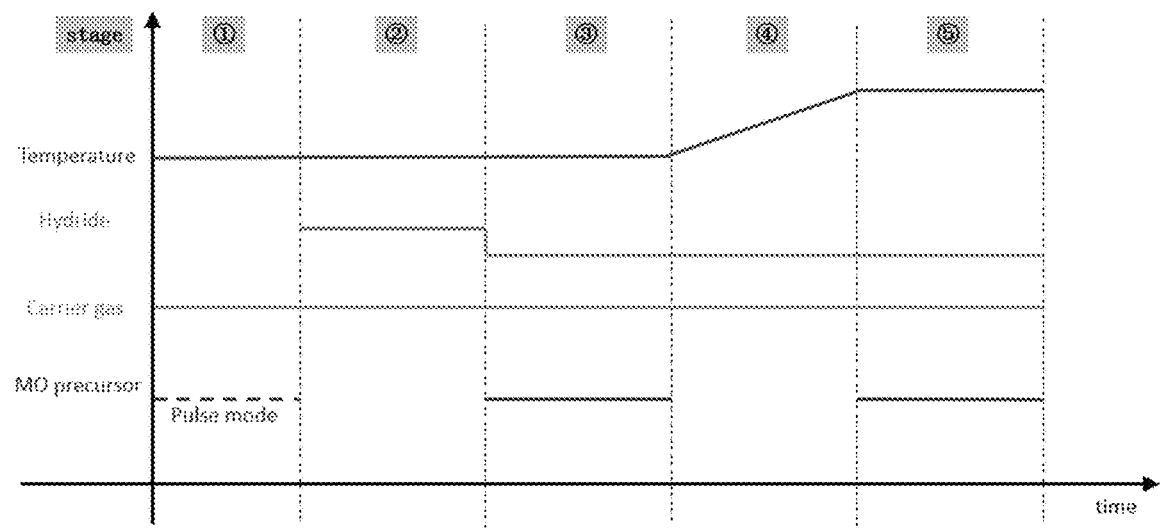
Figure 10:
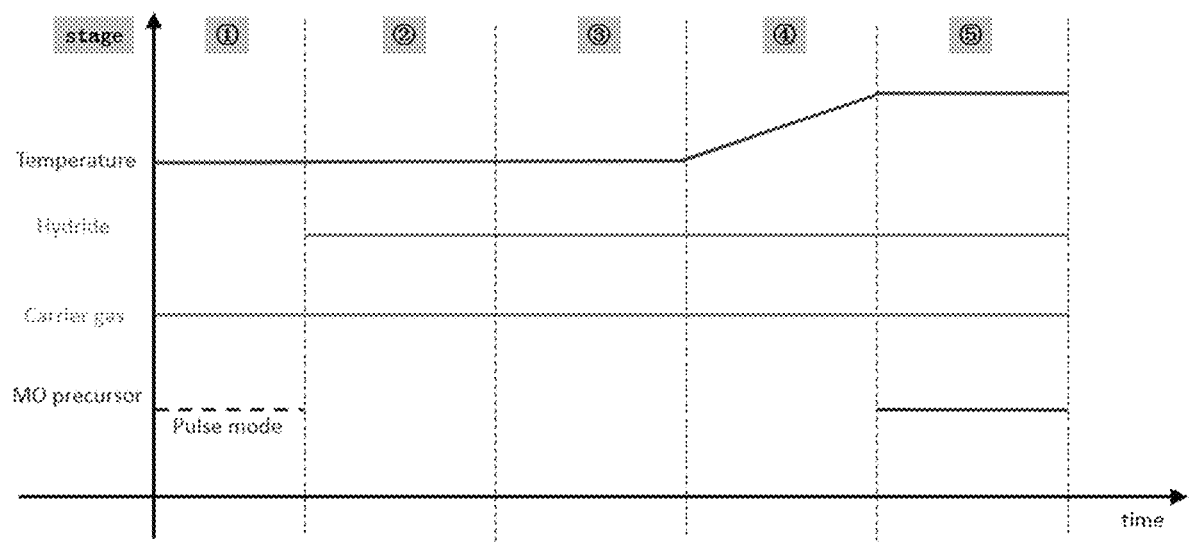
Figure 11:
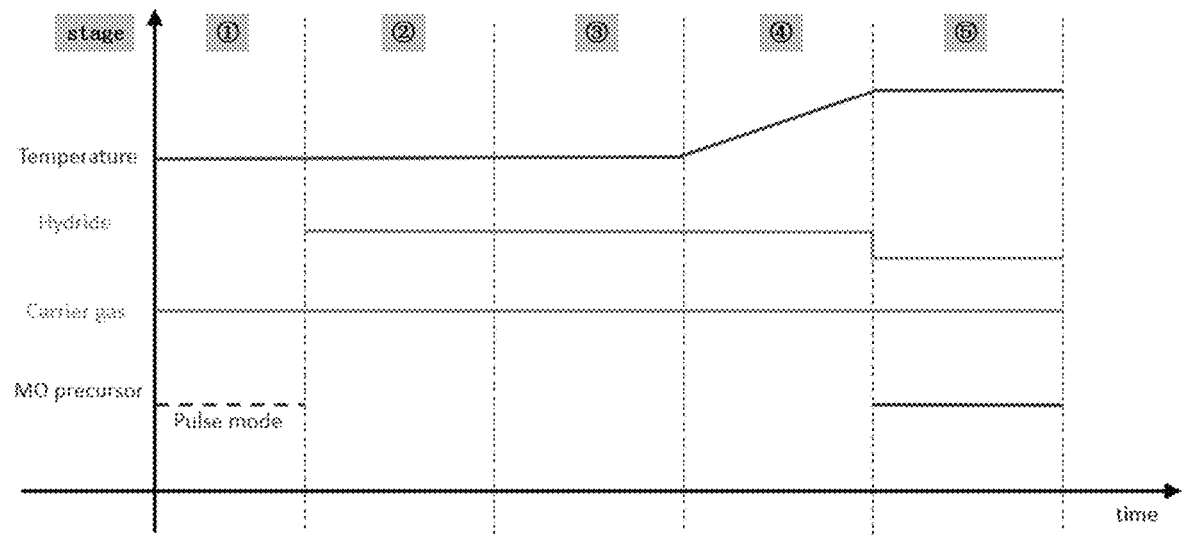
Figure 12:
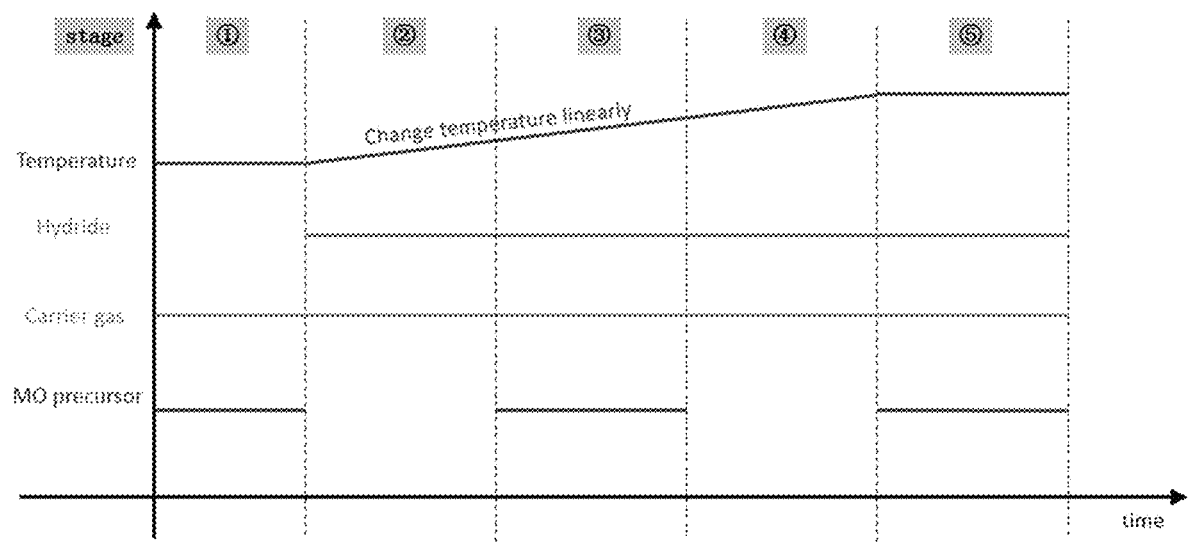
Figure 13:
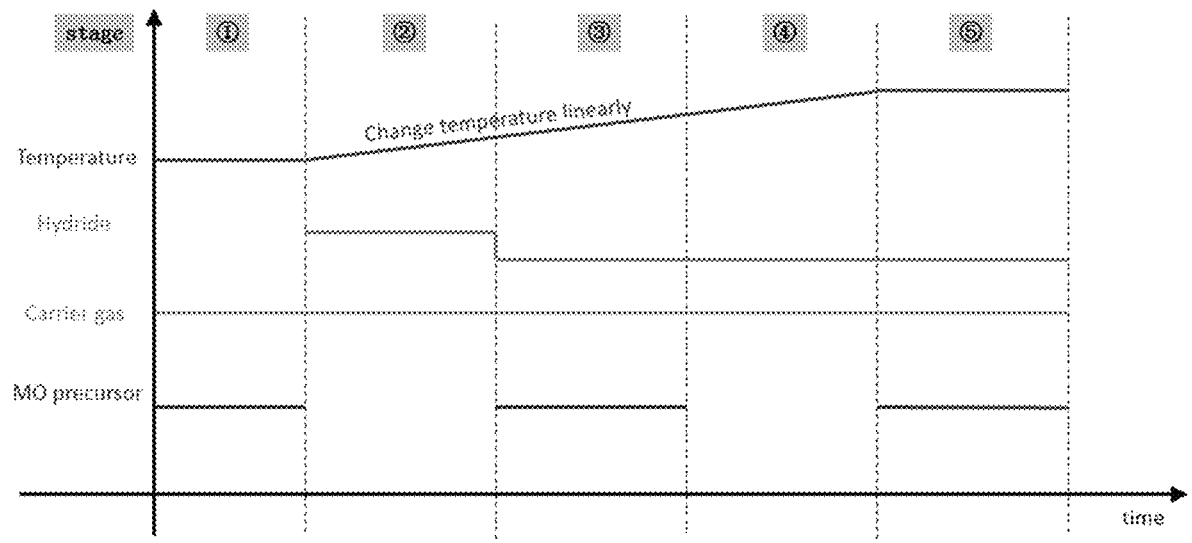
Figure 14:
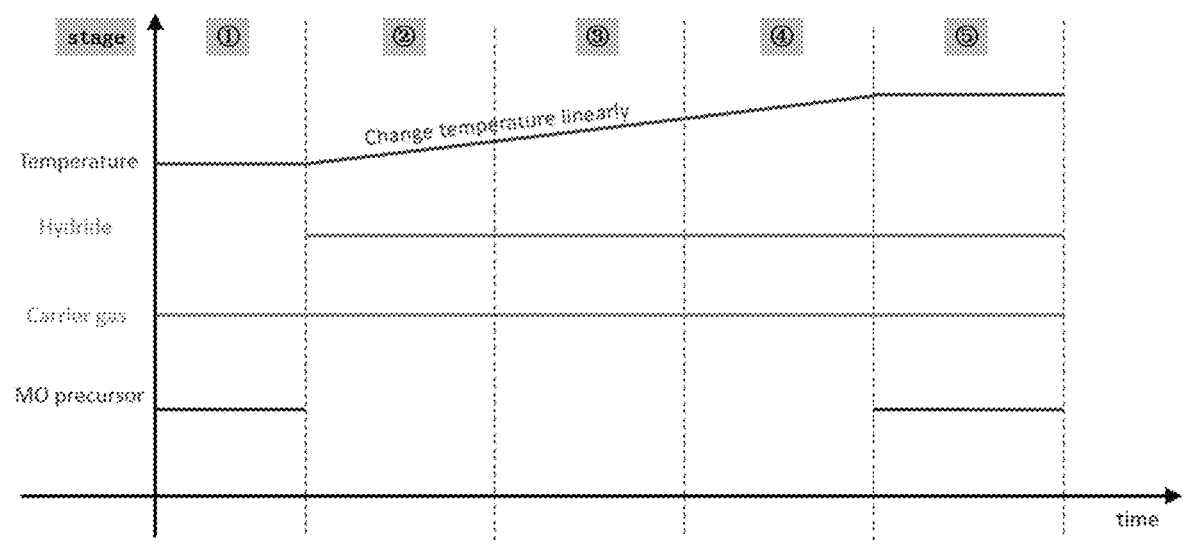
Figure 15:
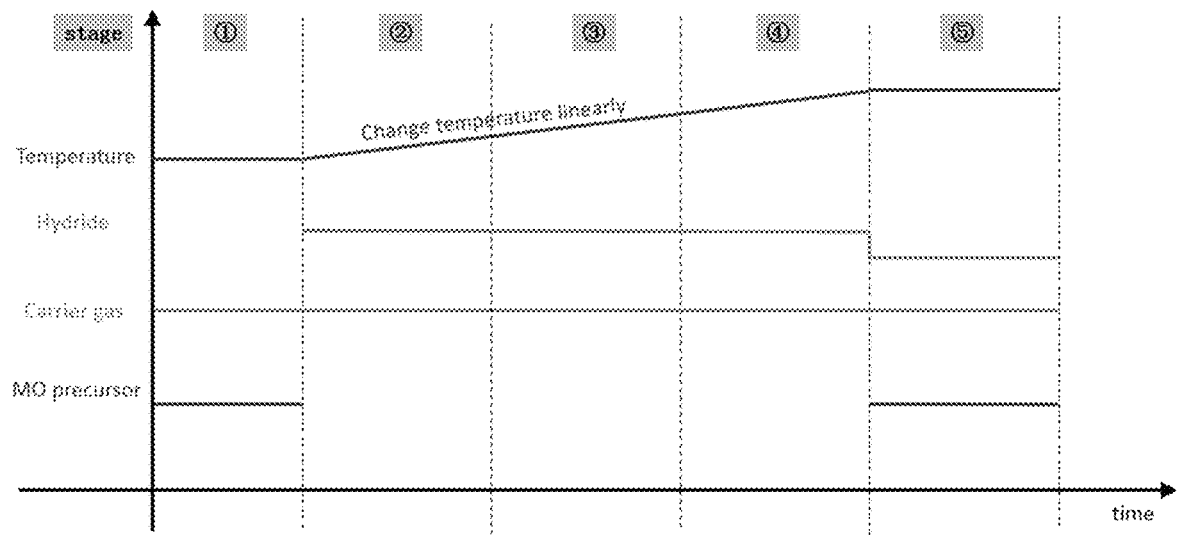
Figure 16:
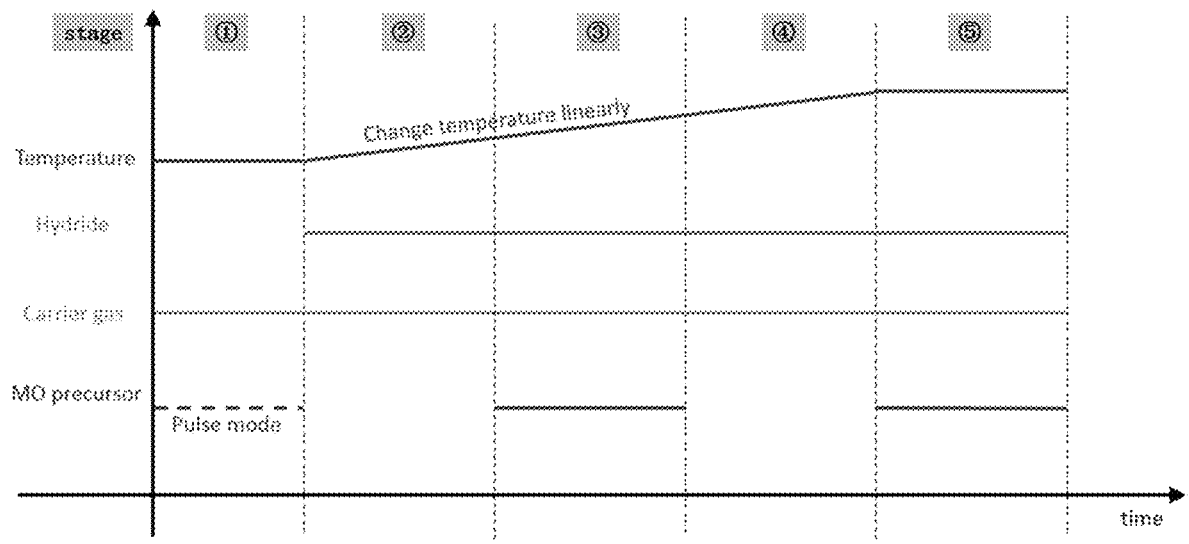
Figure 17:
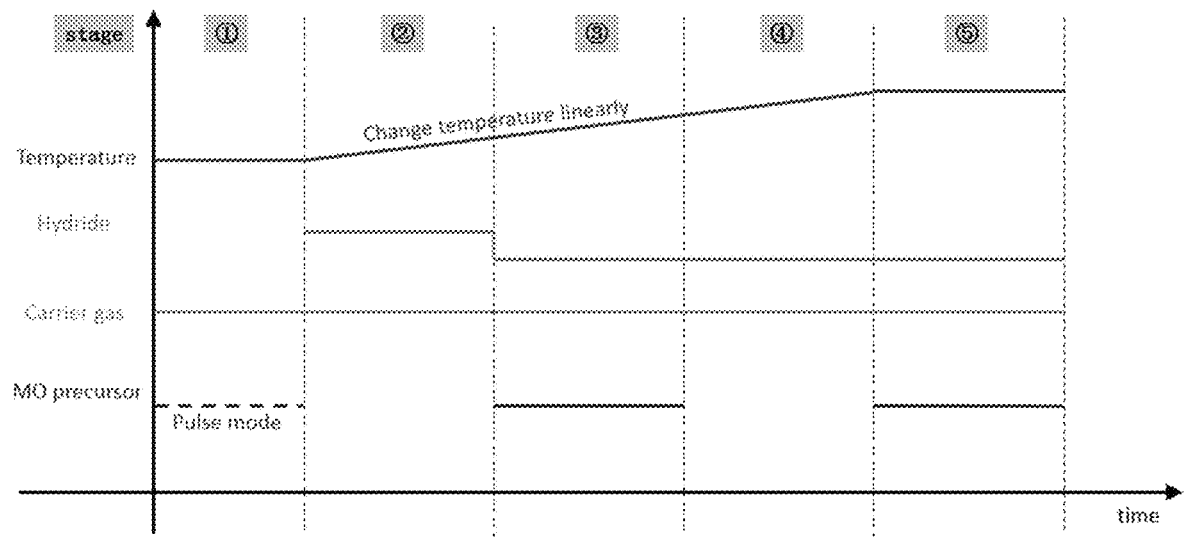
Figure 18:
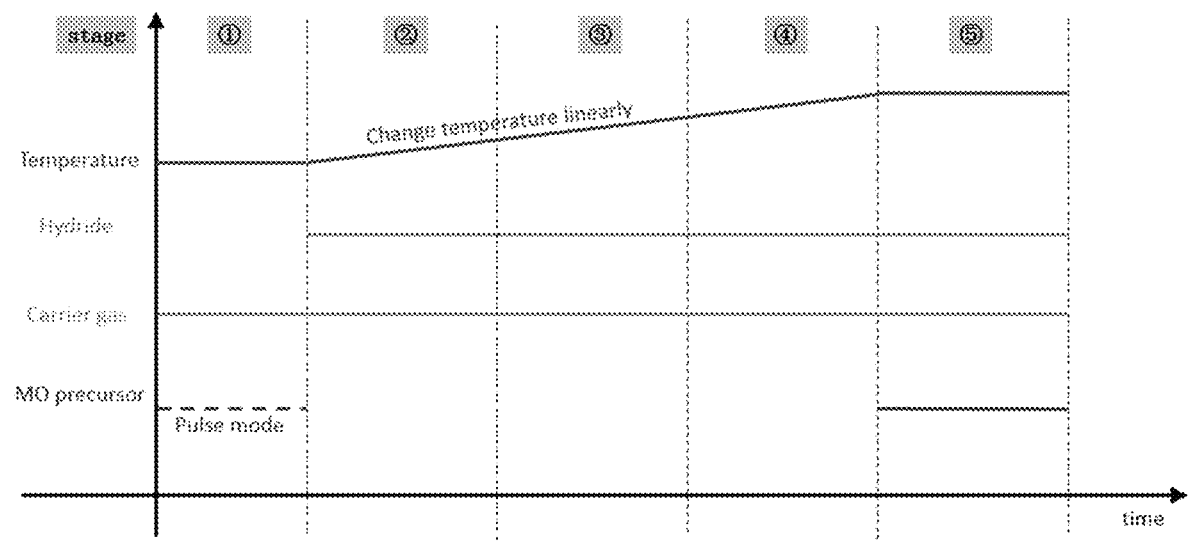
Figure 19:
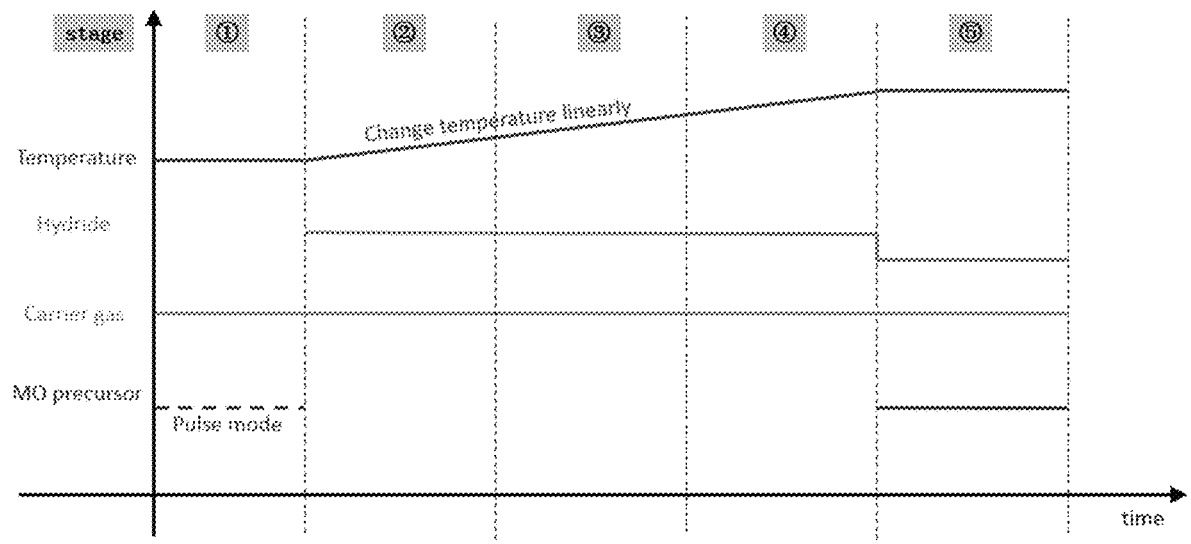
Figure 20:
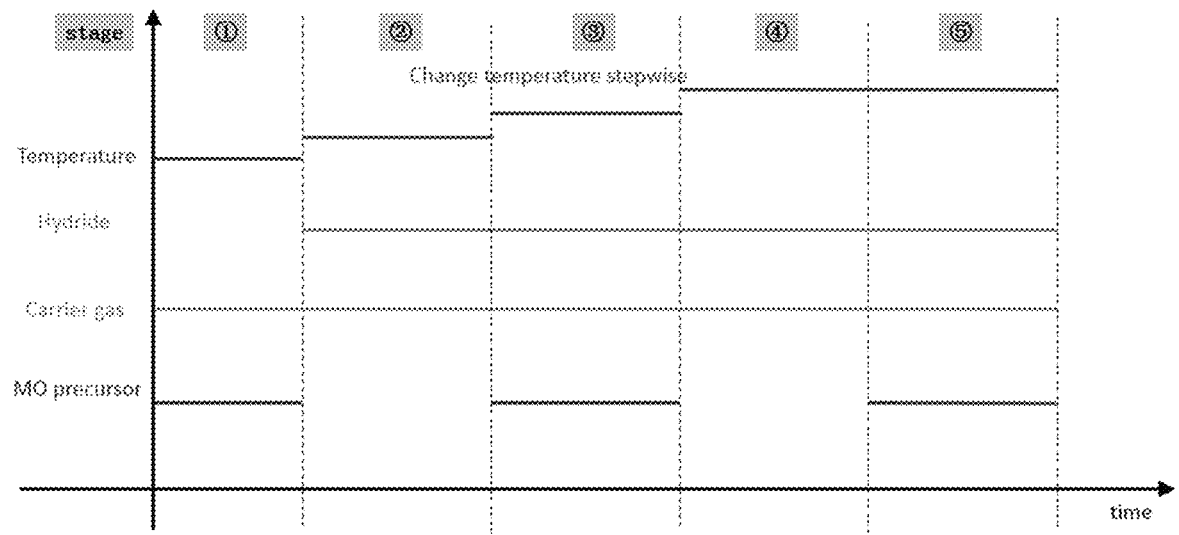
Figure 21:
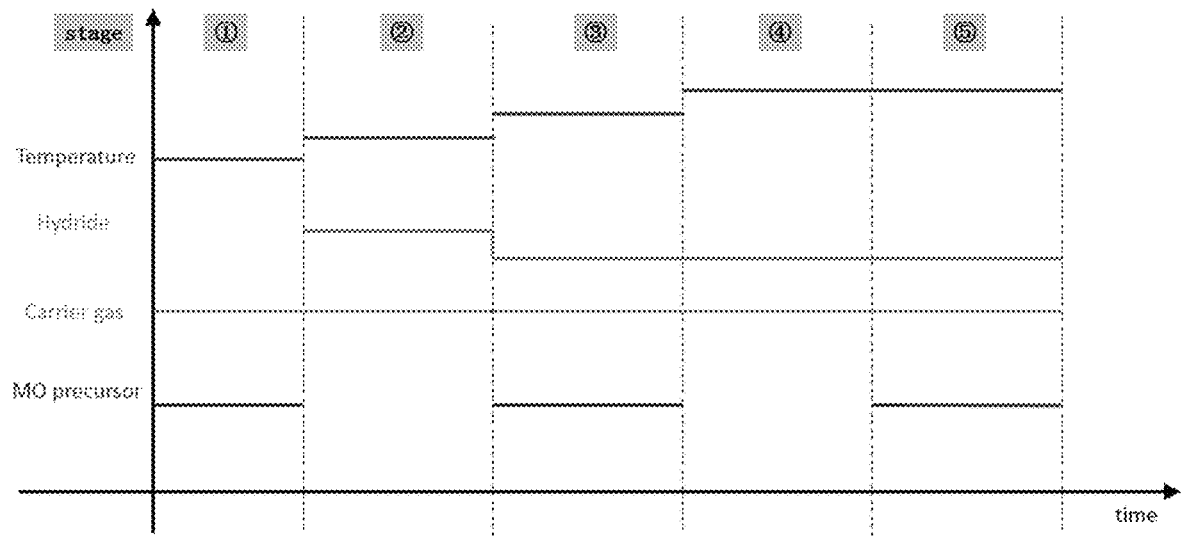
Figure 22:
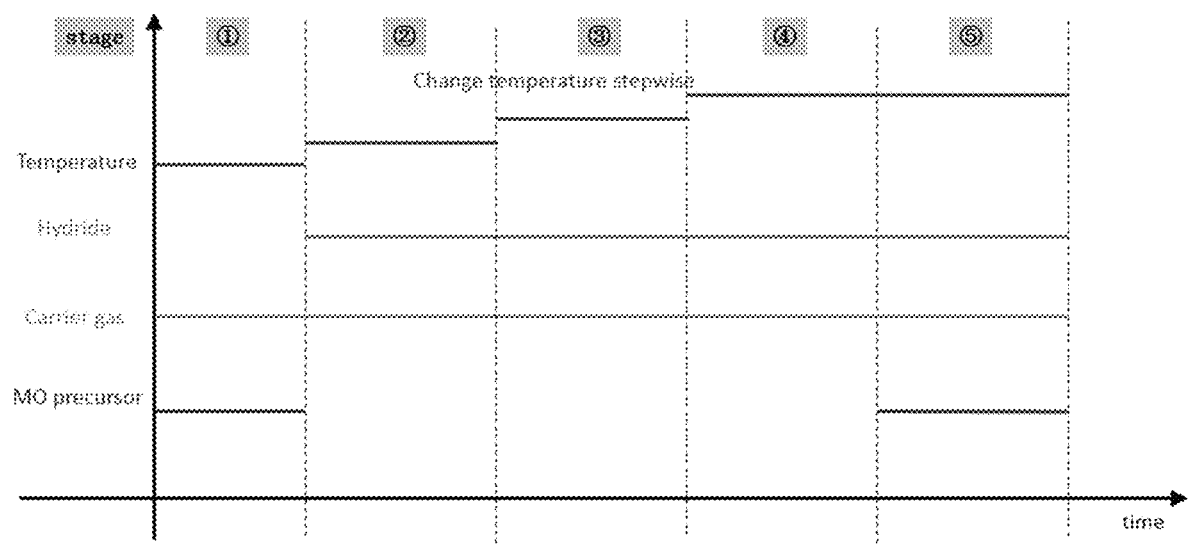
Figure 23:
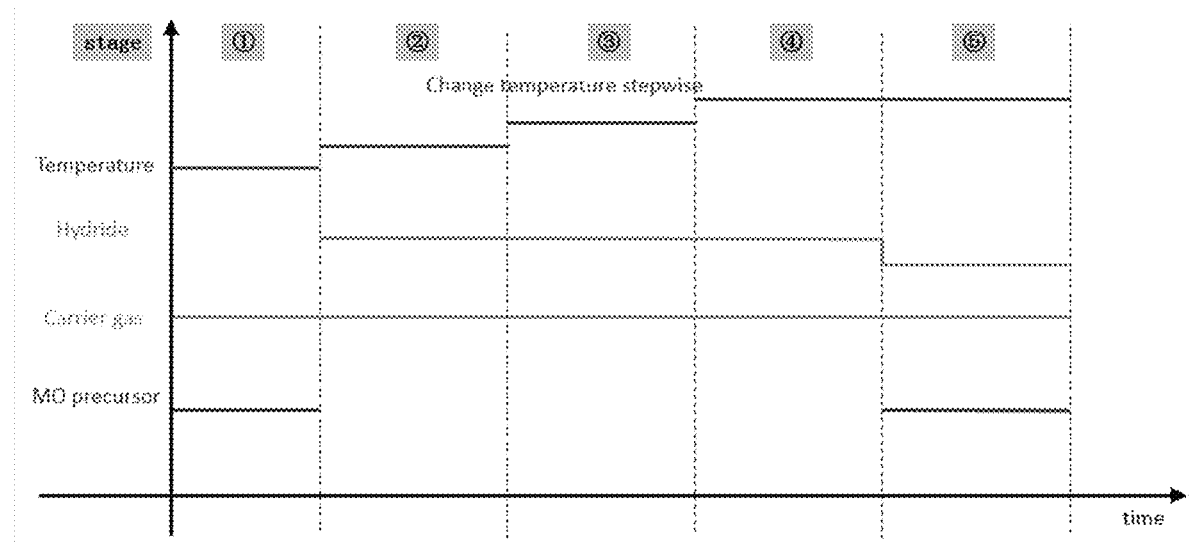
Figure 24:
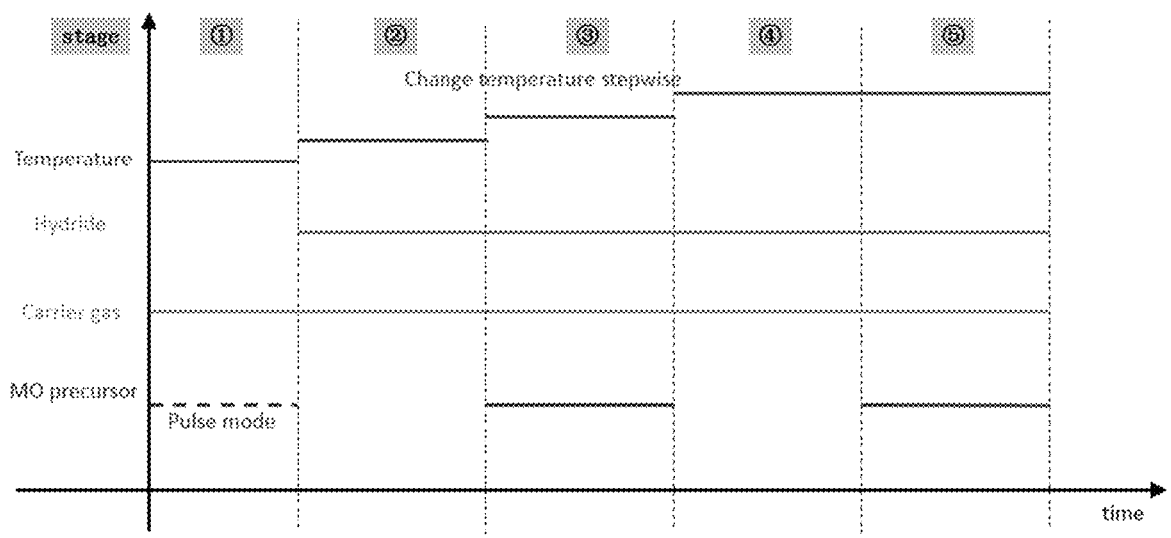
Figure 25:
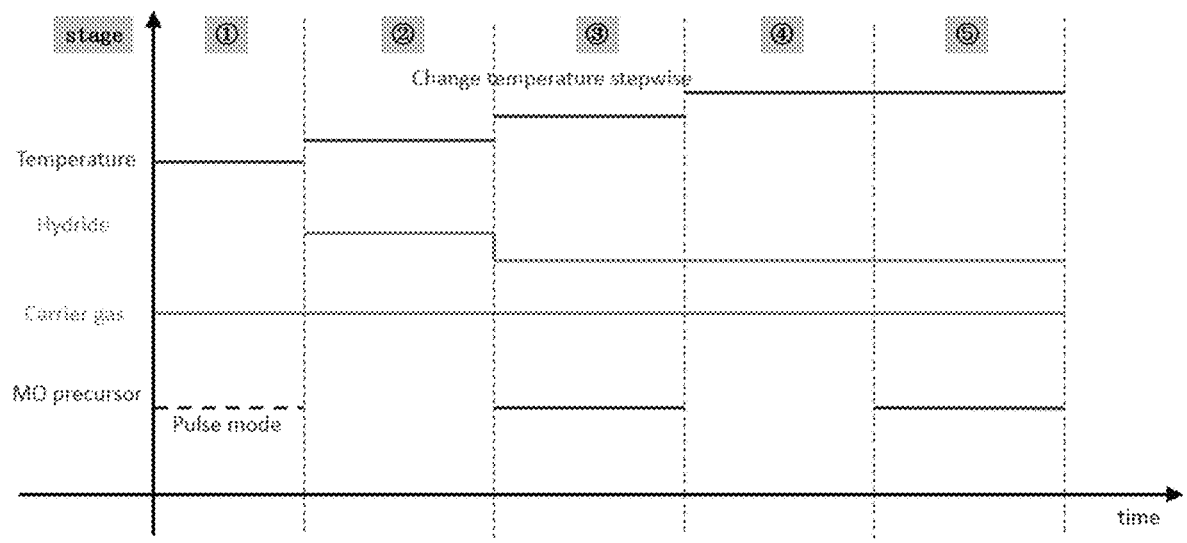
Figure 26:
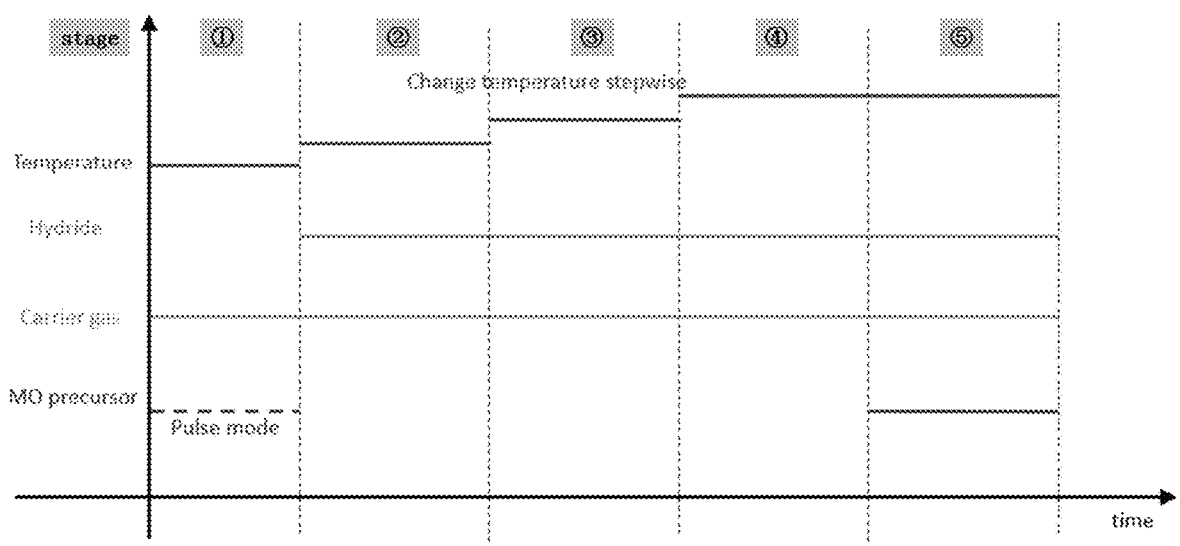
Figure 27:
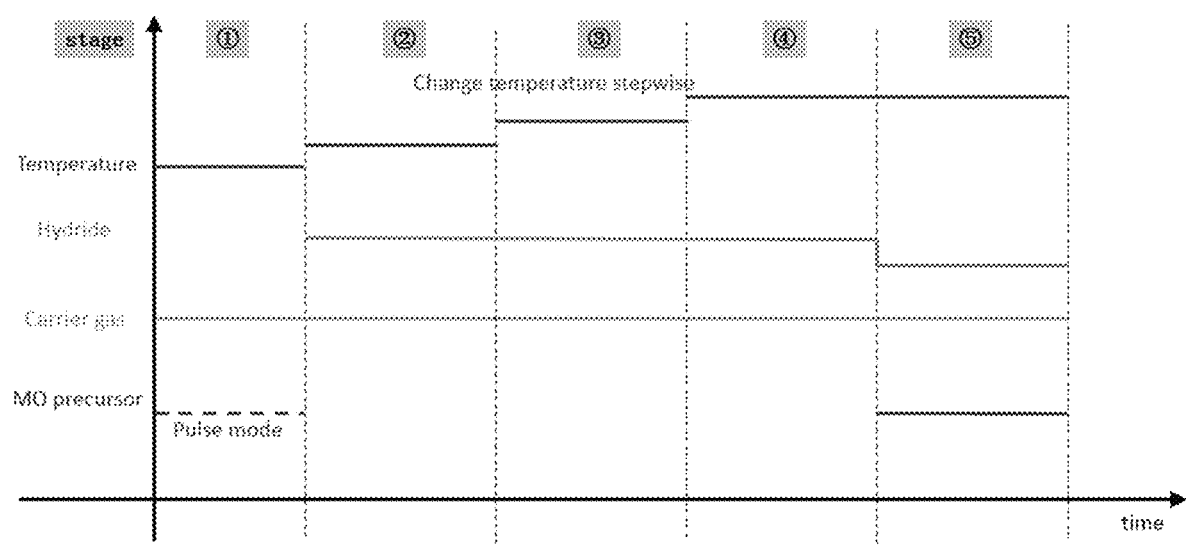

Taking FIG. 4 as an example, in stage 1, the MO precursor is conducted into the reaction container to form the thin film layer. In stage 2, the hydride is conducted into the reaction container, but MO precursor is not conducted into the reaction container to form the one or more recessed holes. In stage 3, the MO precursor is conducted again to form the thin film layer. Optionally, in stage 3, $NH_3$ in the hydride can improve the quality of the thin film layer.

Step S2 and step S3 may be executed alternately multiple times. As shown in FIG. 4, the metal source can be conducted into the reaction container in stages 3 and 5, and the metal source can be stopped in stages 2 and 4.

Optionally, the metal source is conducted into the reaction container intermittently. For example, the metal source is conducted in a pulse mode to achieve uniform growth of the thin film layer. As shown in FIG. 8, FIG. 9, FIG. 10 and FIG. 11, in stage 1 the pulse mode is used to conduct the metal source.

Optionally, in the step S2 and/or the step S3, a temperature in the reaction container may be increased. The present disclosure does not limit the way to increase the temperature in the reaction container. As shown in FIGS. 4-11, the temperature may be increased in pulses. As shown in FIGS. 12-19, the temperature can be increased linearly. As shown in FIGS. 20-27, the temperature may be increased stepwise.

The above-mentioned embodiments are merely illustrative of several implementations of the present disclosure, and the description thereof is relatively specific and detailed, but they cannot be understood as limiting the scope of the present disclosure. It should be noted that a number of variations and modifications may be made by those skilled in the art without departing from the spirit and scope of the present disclosure.

What is claimed is:

1. A method for preparing a substrate, comprising the following steps:
   S1, providing a reaction container in which a base substrate is mounted;
   S2, conducting a metal source into the reaction container, and forming a thin film layer on a surface of the base substrate, wherein a part of a surface of the base substrate is covered by the thin film layer, so that the base substrate is provided with an exposed surface that is not covered by the thin film layer, wherein the thin film layer is a metal thin film; and
   S3, conducting a corrosive gas into the reaction container to form one or more recessed holes in at least a part of the exposed surface, wherein after step S3, a Ga-containing compound is prepared on the thin film layer,
   wherein the thin film layer is made of one of Mg;
   wherein in the step S1, the reaction container is a metal-organic chemical vapor deposition reactor, an atomic deposition reactor or a chemical beam epitaxial reactor; and
   wherein in the step S3, the corrosive gas is one of $NH_3$ and $H_2$;
   wherein a thickness of the thin film layer is less than or equal to 1 nm;
   wherein the thin film layer is provided with pores which correspond to the exposed surface; and
   wherein the metal source is conducted into the reaction container intermittently.

2. The method of claim 1, wherein a diameter of the recessed hole in the step S3 is less than 500 nm.

3. The method of claim 1, wherein in the step S1, the base substrate is made of one of silicon, silicon carbide and gallium nitride.

4. The method of claim 3, wherein when the base substrate is made of silicon, after the step S3, a Ga source is conducted into the reaction container.

5. The method of claim 1, wherein before the step S2, the method further comprises:
   heating the base substrate.

6. The method of claim 5, wherein a temperature of the base substrate is greater than or equal to a melting point of the thin film layer.

7. The method of claim 1, wherein a thickness of the thin film layer is less than or equal to 10 nm.

8. The method of claim 1, wherein a thickness of the thin film layer is less than or equal to a thickness of a monolayer.

9. The method of claim 1, further comprising:
   conducting nitride gas to perform a nitridation reaction of the thin film layer.

10. The method of claim 1, wherein the step S2 and the step S3 are executed alternately multiple times.

11. The method of claim 1, further comprising increasing a temperature in the reaction container in the step S2 and/or the step S3.

* * * * *